(12) United States Patent
Cao et al.

(10) Patent No.: US 11,581,361 B2
(45) Date of Patent: Feb. 14, 2023

(54) PACKAGING METHODS OF SEMICONDUCTOR DEVICES

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/236,508

(22) Filed: Apr. 21, 2021

(65) Prior Publication Data
US 2021/0265400 A1 Aug. 26, 2021

Related U.S. Application Data

(63) Continuation of application No. PCT/CN2018/114107, filed on Nov. 6, 2018.

(51) Int. Cl.
*G01T 1/24* (2006.01)
*H01L 27/146* (2006.01)

(52) U.S. Cl.
CPC .......... *H01L 27/1469* (2013.01); *G01T 1/242* (2013.01); *G01T 1/247* (2013.01); *H01L 27/14618* (2013.01); *H01L 27/14636* (2013.01); *H01L 27/14659* (2013.01); *H01L 27/14661* (2013.01)

(58) Field of Classification Search
CPC .......... H01L 27/1469; H01L 27/14618; H01L 27/14636; H01L 27/14659; H01L 27/14661; H01L 23/3107; H01L 24/80; H01L 2221/68327; H01L 2224/0401; H01L 2224/05573; H01L 2224/056; H01L 2224/05644; H01L 2224/05647; H01L 2224/05664; H01L 2224/05669; H01L 2224/08145; H01L 2224/16145; H01L 2224/80006; H01L 2224/81005; H01L 2924/00014; H01L 2924/18161; H01L 21/6835; G01T 1/242; G01T 1/247
See application file for complete search history.

(56) References Cited

U.S. PATENT DOCUMENTS 5,610,425 A * 3/1997 Quigley .............. H01L 27/0262
257/140
2010/0327169 A1 12/2010 Korn
2012/0223241 A1 9/2012 Kim et al.
(Continued)

FOREIGN PATENT DOCUMENTS

CN 101079386 A 11/2007
CN 102486992 A 6/2012
(Continued)

*Primary Examiner* — Kiho Kim
(74) *Attorney, Agent, or Firm* — IPro, PLLC; Qian Gu

(57) ABSTRACT

Disclosed herein is a method comprising: forming a first electrically conductive layer on a first surface of a substrate of semiconductor, wherein the first electrically conductive layer is in electrical contact with the semiconductor; bonding, at the first electrically conductive layer, a support wafer to the substrate of semiconductor; thinning the substrate of semiconductor.

24 Claims, 11 Drawing Sheets

(56) References Cited

U.S. PATENT DOCUMENTS

| | | | |
|---|---|---|---|
| 2014/0084410 A1* | 3/2014 | Okigawa | H01L 27/1464 257/447 |
| 2014/0270057 A1 | 9/2014 | Bartolome et al. | |
| 2016/0379845 A1 | 12/2016 | Oh et al. | |
| 2017/0186808 A1* | 6/2017 | Chiu | G03F 7/32 |
| 2017/0219723 A1 | 8/2017 | Yakimov et al. | |
| 2018/0017687 A1 | 1/2018 | Cao et al. | |

FOREIGN PATENT DOCUMENTS

| | | | | |
|---|---|---|---|---|
| CN | 102683524 A | | 9/2012 | |
| JP | 2018056259 A | * | 4/2018 | ....... H01L 21/02076 |
| TW | 201241964 A | | 10/2012 | |
| TW | 201242003 A | | 10/2012 | |
| TW | 201636640 A | | 10/2016 | |

* cited by examiner

US 11,581,361 B2

PACKAGING METHODS OF SEMICONDUCTOR DEVICES

TECHNICAL FIELD

The disclosure herein relates to methods of packaging of semiconductor devices.

BACKGROUND

As electronics applications shrink in size, integrated circuit (IC) packaged devices are reduced both in footprint and thickness. The drive for the development of smaller packages is the demand for portable communications devices, such as memory cards, smart cards, cellular telephones and portable computing.

SUMMARY

Disclosed herein is a method comprising: forming a first electrically conductive layer on a first surface of a substrate of semiconductor, wherein the first electrically conductive layer is in electrical contact with the semiconductor; bonding, at the first electrically conductive layer, a support wafer to the substrate of semiconductor; thinning the substrate of semiconductor.

According to an embodiment, the method further comprises forming electric contacts on a second surface of the substrate of semiconductor opposite the first surface.

According to an embodiment, the method further comprises obtaining a chip with circuitry therein; electrically connecting the circuitry to the electric contacts by bonding the chip to the substrate of semiconductor at the second surface.

According to an embodiment, the method further comprises encapsulating the chip and the substrate of semiconductor.

According to an embodiment, the method further comprises exposing at least a portion of first electrically conductive layer by removing the support wafer.

According to an embodiment, the method further comprises forming p-n junctions or p-i-n junctions in the substrate of semiconductor.

According to an embodiment, the first surface is polished.

According to an embodiment, the first electrically conductive layer comprises a metal.

According to an embodiment, the metal comprises Al, Au, or a combination thereof.

According to an embodiment, the support wafer comprises a layer of silicon oxide.

According to an embodiment, the support wafer comprises a second electrically conductive layer in contact with the first electrically conductive layer after bonding.

According to an embodiment, the method further comprises laser annealing the substrate of semiconductor.

According to an embodiment, the method further comprises thinning the substrate of semiconductor comprises performing chemical-mechanical planarization on the substrate of semiconductor, etching the substrate of semiconductor, or both.

According to an embodiment, the method further comprises electrically grounding the first electrically conductive layer.

According to an embodiment, the circuitry comprises an electronic system configured to process or analyze electrical signals generated from the substrate of semiconductor.

According to an embodiment, the electronic system comprises a contact pad.

According to an embodiment, the electronic system comprises: a first voltage comparator configured to compare a voltage of the contact pad to a first threshold; a second voltage comparator configured to compare the voltage to a second threshold; a counter configured to register a number of particles of radiation absorbed by the substrate; a controller; wherein the controller is configured to start a time delay from a time at which the first voltage comparator determines that an absolute value of the voltage equals or exceeds an absolute value of the first threshold; wherein the controller is configured to activate the second voltage comparator during the time delay; wherein the controller is configured to cause the number registered by the counter to increase by one, if the second voltage comparator determines that an absolute value of the voltage equals or exceeds an absolute value of the second threshold.

According to an embodiment, the electronic system further comprises an integrator electrically connected to the contact pad, wherein the integrator is configured to collect charge carriers from the contact pad.

According to an embodiment, the controller is configured to activate the second voltage comparator at a beginning or expiration of the time delay.

According to an embodiment, the electronic system further comprises a voltmeter, wherein the controller is configured to cause the voltmeter to measure the voltage upon expiration of the time delay.

According to an embodiment, the controller is configured to determine energy a particle of radiation based on a value of the voltage measured upon expiration of the time delay.

According to an embodiment, the controller is configured to connect the contact pad to an electrical ground.

According to an embodiment, a rate of change of the voltage is substantially zero at expiration of the time delay.

According to an embodiment, a rate of change of the voltage is substantially non-zero at expiration of the time delay.

DETAILED DESCRIPTION

Figure 1:
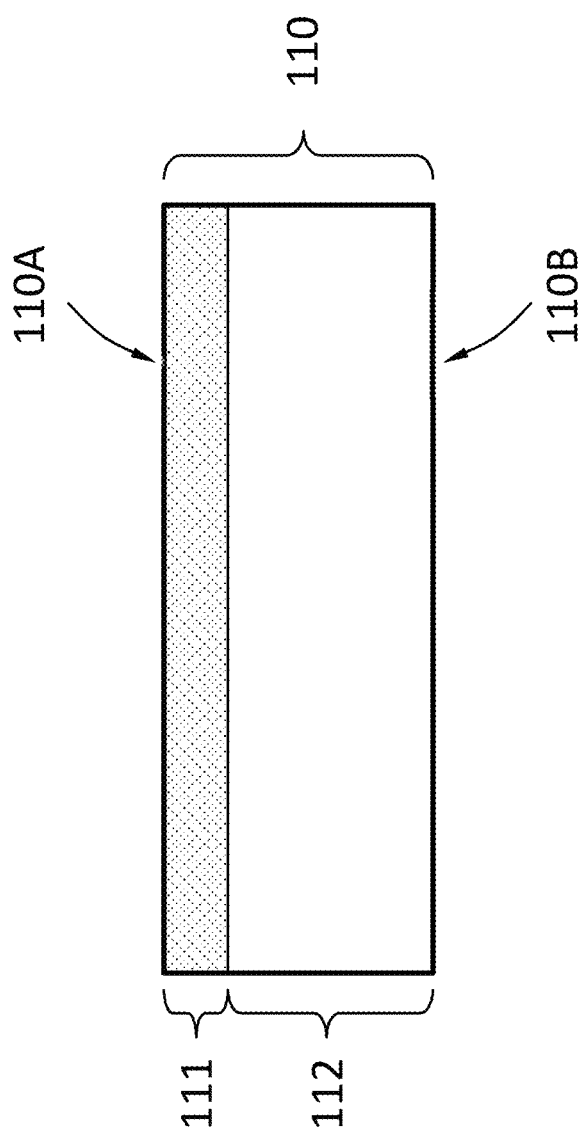
FIG. 1 schematically shows an exemplary cross-sectional view of a substrate of semiconductor.

FIG. 1 schematically shows a cross-sectional view of a substrate 110 of semiconductor. The substrate 110 has a first surface 110A and a second surface 110B. The second surface 110B is opposite to the first surface 110A. The first surface 110A, the second surface 110B, or both, may be polished. The semiconductor of the substrate 110 may be silicon, germanium, GaAs, CdTe, CdZnTe, or a combination thereof. The semiconductor of the substrate 110 may be other suitable semiconductor materials. The substrate may include a first doped region 111 and an intrinsic region 112. The first doped region 111 may be less than 10 microns thick. The total thickness of the substrate 110 may be several hundred microns.

FIG. 2A-FIG. 2G schematically show a method, according to an embodiment.

Figure 2A:
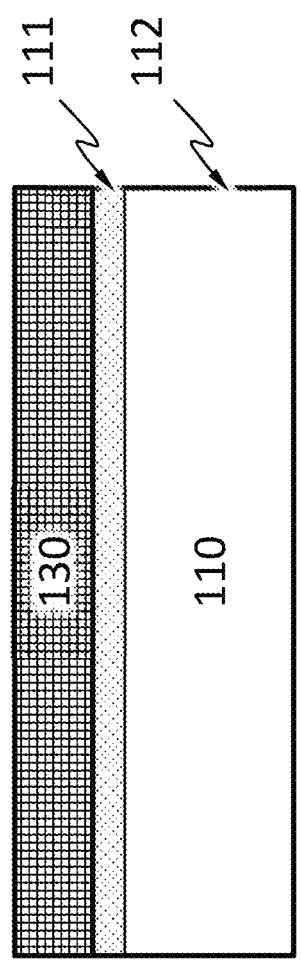
FIG. 2A-FIG. 2G schematically show a method, according to an embodiment.

FIG. 2A schematically shows a first electrically conductive layer 130 is formed on the first surface 110A of the substrate 110. The first electrically conductive layer 130 is in electrical contact with the substrate 110. If the first doped region 111 is present, the first electrically conductive layer 130 may be in electrical contact with the first doped region 111. The first electrically conductive layer 130 may comprise a metal like Al, Au, or a combination thereof. The first electrically conductive layer 130 may comprise other suitable materials. The thickness of the first electrically conductive layer 130 may be less than 1 micron.

Figure 2B:
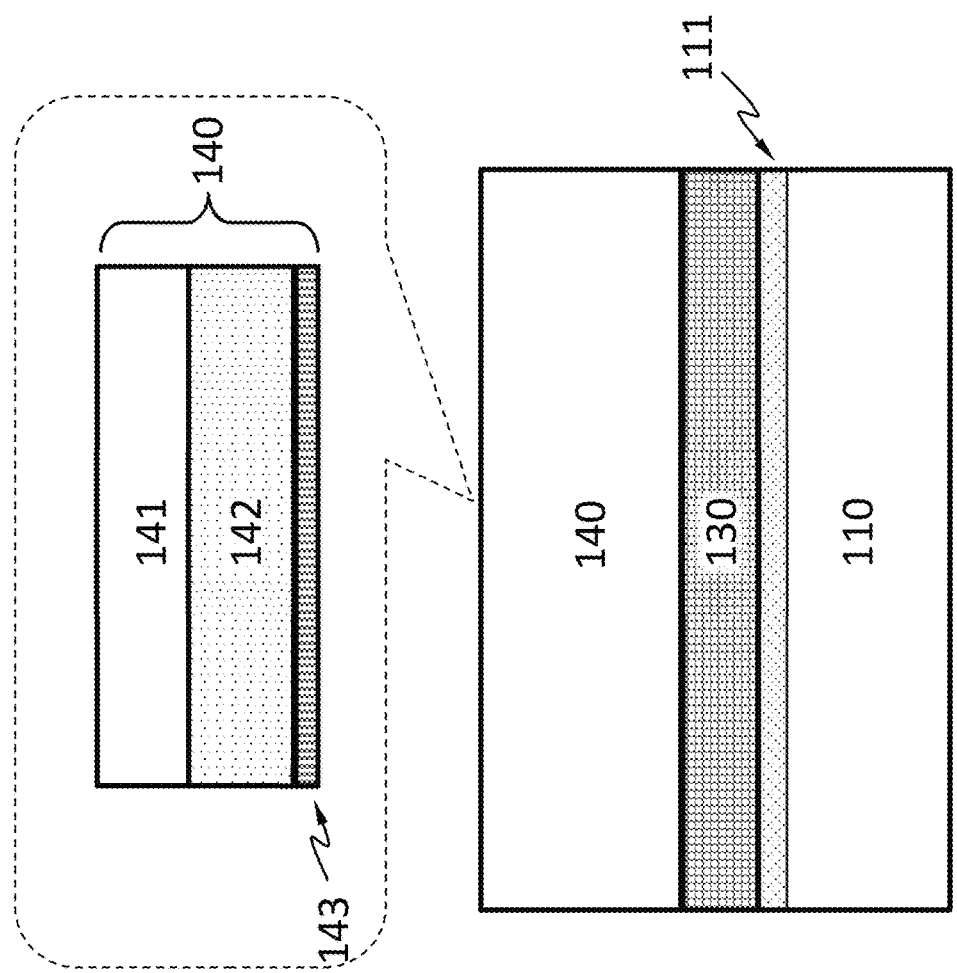

FIG. 2B schematically shows that a support wafer 140 is bonded to the substrate 110, at the first electrically conductive layer 130. The support wafer 140 may include a layer of insulator 142. The insulator may be an oxide such as silicon oxide, a nitride such as silicon nitride, an oxynitride such as silicon oxynitride, or other suitable materials. The support wafer 140 may include a layer of semiconductor 141. The support wafer 140 may include a second electrically conductive layer 143 in contact with the first electrically conductive layer 130 after bonding. The second electrically conductive layer 143 include a metal like Al, Au, or a combination thereof. The second electrically conductive layer 143 may comprise other suitable materials. Bonding the support wafer 140 and the substrate 110 may be by direct bonding. Direct bonding may be at an elevated temperature but not necessarily so.

Figure 2C:
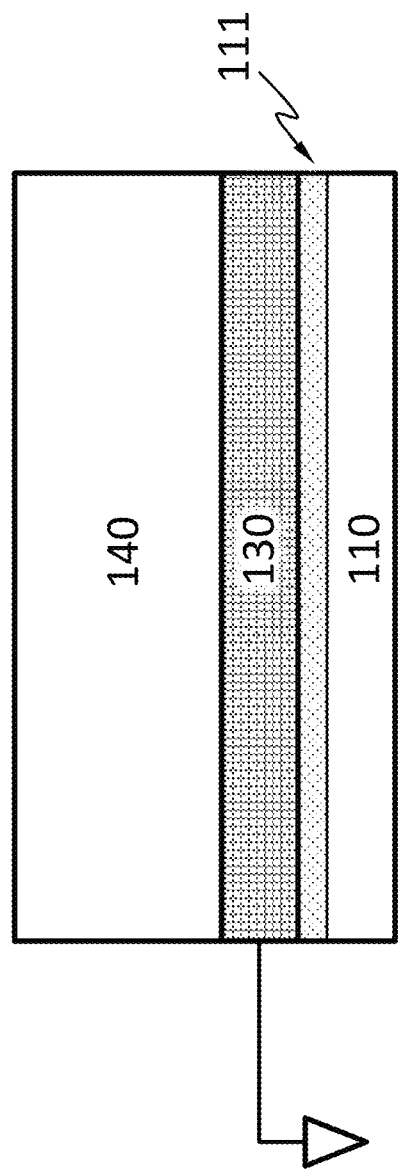

FIG. 2C schematically shows that the substrate 110 may be thinned. Thinning the substrate 110 may be by performing chemical-mechanical planarization, wet etching, or a combination thereof, on the second surface 110б of the substrate 110. For example, the substrate 110 after thinning may have at thickness of 200 microns or less, 100 microns or less, 50 microns or less, 20 microns or less, or 5 microns or less. The first electrically conductive layer 130 may be electrically grounded.

Figure 2D:
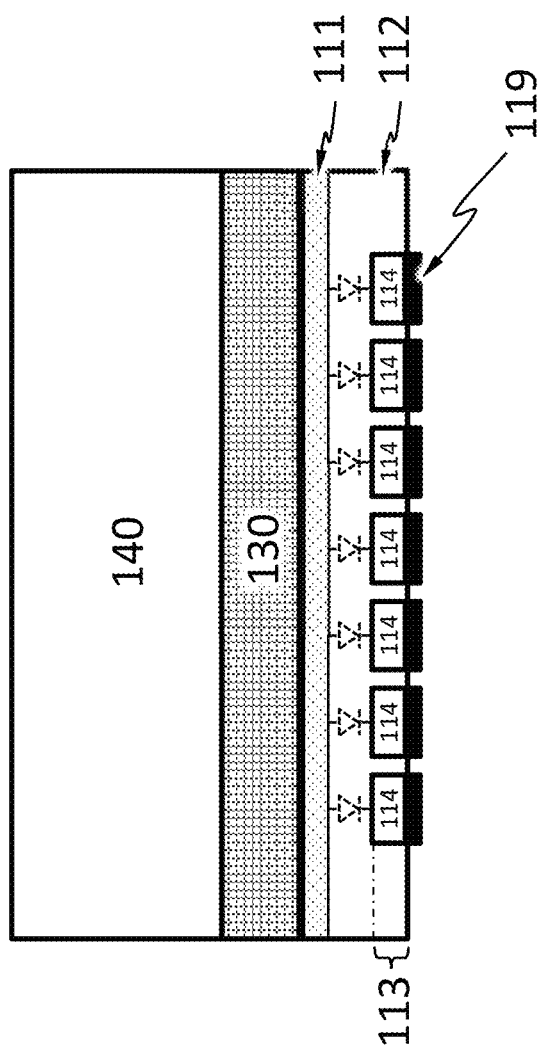

FIG. 2D schematically shows that electric contacts 119 may be formed on the second surface 110B of the substrate 110. FIG. 2D also schematically shows that p-n junctions or p-i-n junctions may be formed in the substrate 110. In an example where the first doped region 111 is present in the substrate, a second doped region 113 having discrete portions 114 may be formed in the substrate 110. The second doped region 113 may be separated from the first doped region 111 by the intrinsic region 112 if the intrinsic region 112 is present. The discrete portions 114 may be separated from one another by the first doped region 111 or the intrinsic region 112 if the intrinsic region 112 is present. The first doped region 111 and the second doped region 113 have opposite types of doping (e.g., region 111 is p-type and region 113 is n-type, or region 111 is n-type and region 113 is p-type). Each of the discrete portions 114 of the second doped region 113 forms a p-n junction with the first doped region 111, or forms a p-i-n junction with the first doped region 111 and the intrinsic region 112. The first doped region 111 may also have discrete portions. The electric contacts 119 may be gold, copper, platinum, palladium, doped silicon, or other suitable materials. The electric contacts 119 may be respectively in electrical contact with the discrete portions 114. In one embodiment, laser annealing is performed on the substrate 110, e.g., after forming the second doped region 113.

Figure 2E:
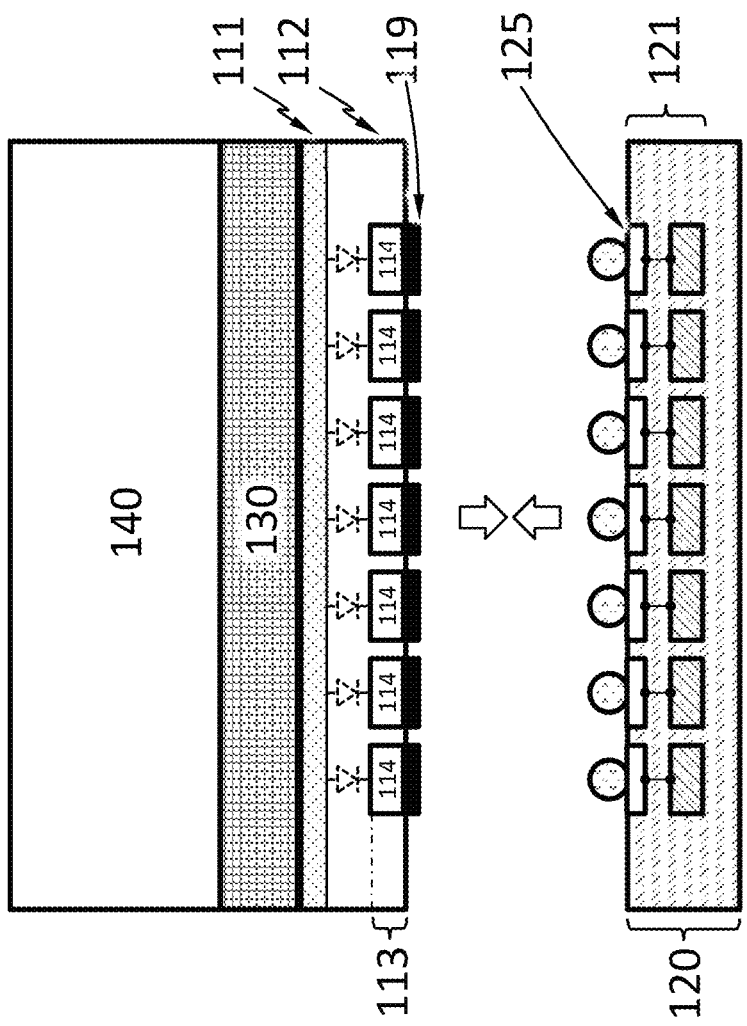
Figure 2F:
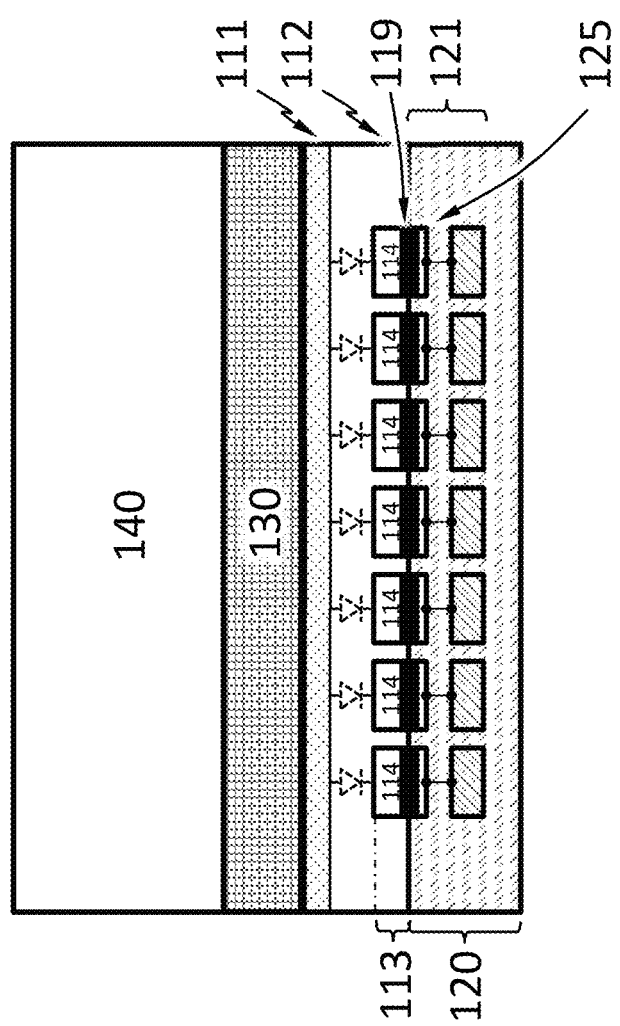

FIG. 2E and FIG. 2F schematically shows a chip 120 comprising circuitry therein may be obtained, and the circuitry may be electrically connected to the electric contacts 119, for example, by bonding the chip 120 to the substrate 110 at the second surface 110B. Bonding the chip 120 to the substrate 110 may be by a suitable technique such as direct bonding or flip chip bonding. The circuitry may include an electronic system 121 configured to process or analyze electrical signals generated from the substrate 110. The electronic system 121 may include a contact pad 125. The contact pad 125 may be configured to be electrically connected to one of the electric contacts 119 of the substrate 110. The contact pad 125 may be a layer of metal or doped semiconductor. For example, the contact pad 125 may be gold, copper, platinum, palladium, doped silicon, etc.

Figure 2G:
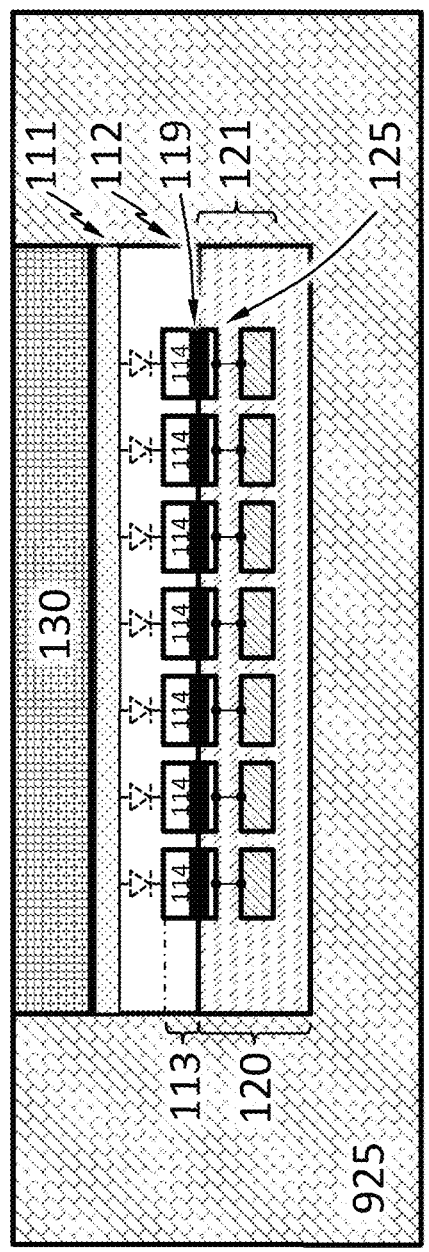

FIG. 2G schematically shows that at least a portion of first electrically conductive layer 130 may be exposed by removing the support wafer 140. For example, the support wafer 140 may be ground away, etched away, or separated from the substrate 110. FIG. 2G also schematically shows that the chip 120 and the substrate 110 may be encapsulated, for example, in a matrix 925. The matrix 925 may be a polymer, glass or other suitable material.

Figure 3A:
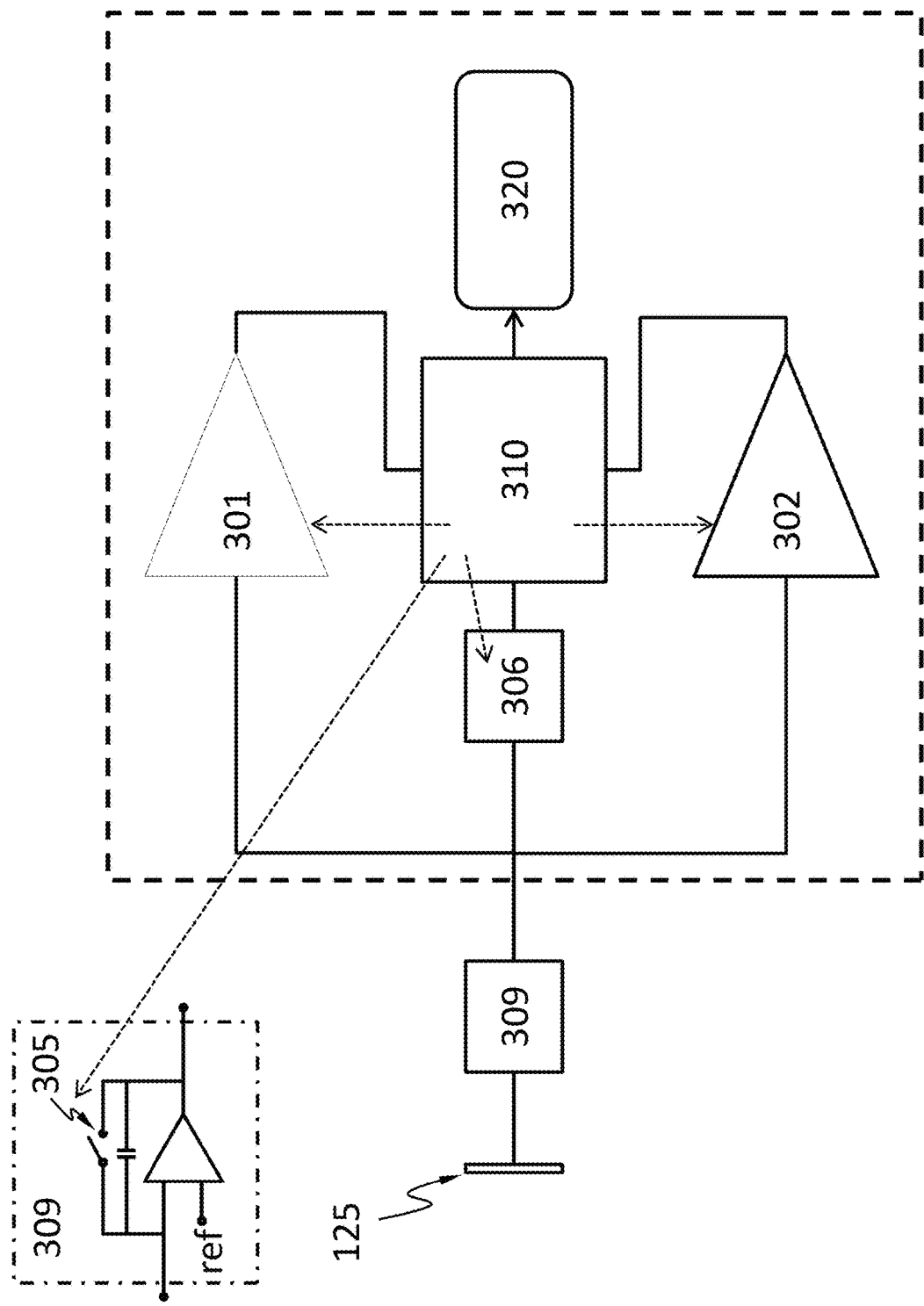
FIG. 3A and FIG. 3B each show a component diagram of an electronic system.
Figure 3B:
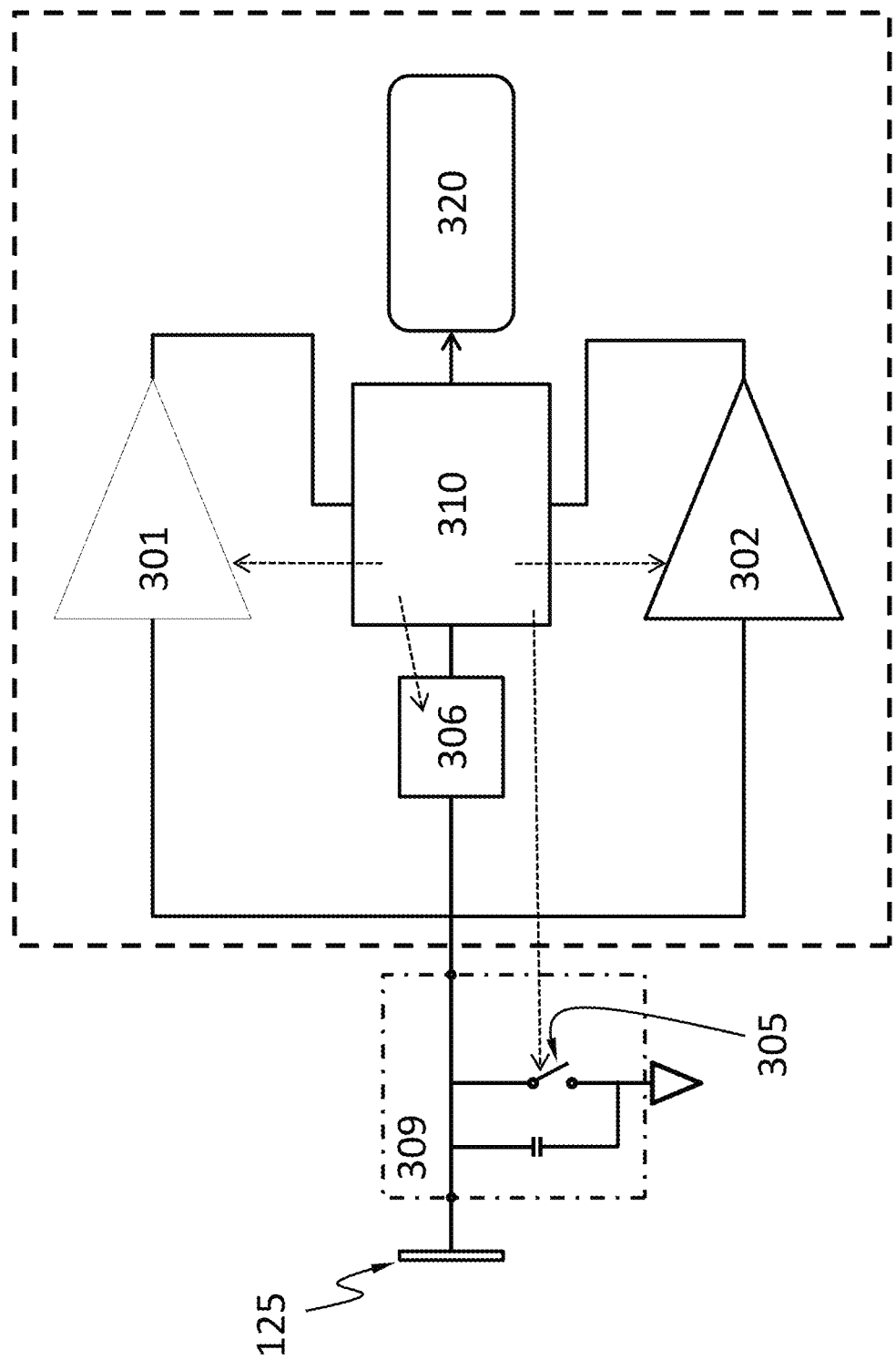

FIG. 3A and FIG. 3B each show a component diagram of the electronic system 121, according to an embodiment. The electronic system 121 may include a first voltage comparator 301, a second voltage comparator 302, a counter 320, a switch 305, a voltmeter 306 and a controller 310.

The first voltage comparator 301 is configured to compare the voltage of the contact pad 125 to a first threshold. The first voltage comparator 301 may be configured to monitor the voltage directly, or calculate the voltage by integrating an electric current flowing through the contact pad 125 over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first threshold may be 5-10%, 10%-20%, 20-30%, 30-40% or 40-50% of the maximum voltage one incident particle of radiation may generate in the substrate 110. The maximum voltage may depend on the energy of the particle of radiation, the material of the substrate 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the contact pad 125 over a period of time. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, \text{ if } x \geq 0 \\ -x, \text{ if } x \leq 0 \end{cases}.$$

The second threshold may be 200%-300% of the first threshold. The second threshold may be at least 50% of the maximum voltage one incident particle of radiation may generate in the substrate 110. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the electronic system 121 to operate under a high flux of incident radiation.

The counter 320 is configured to register a number of particles of radiation reaching the substrate 110. The counter 320 may be a software component (e.g., a number stored in a computer memory) or a hardware component (e.g., a 4017 IC and a 7490 IC).

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 310 may be configured to activate the second voltage comparator 302 during (including the beginning and the expiration) the time delay. In an embodiment, the controller 310 is configured to activate the second voltage comparator 302 at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold.

The controller 310 may be configured to cause the voltmeter 306 to measure the voltage upon expiration of the time delay. The controller 310 may be configured to connect the contact pad 125 to an electrical ground, so as to reset the voltage and discharge any charge carriers accumulated on the contact pad 125. In an embodiment, the contact pad 125 are connected to an electrical ground after the expiration of the time delay. In an embodiment, the contact pad 125 are connected to an electrical ground for a finite reset time period. The controller 310 may connect the contact pad 125 to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

Figure 4:
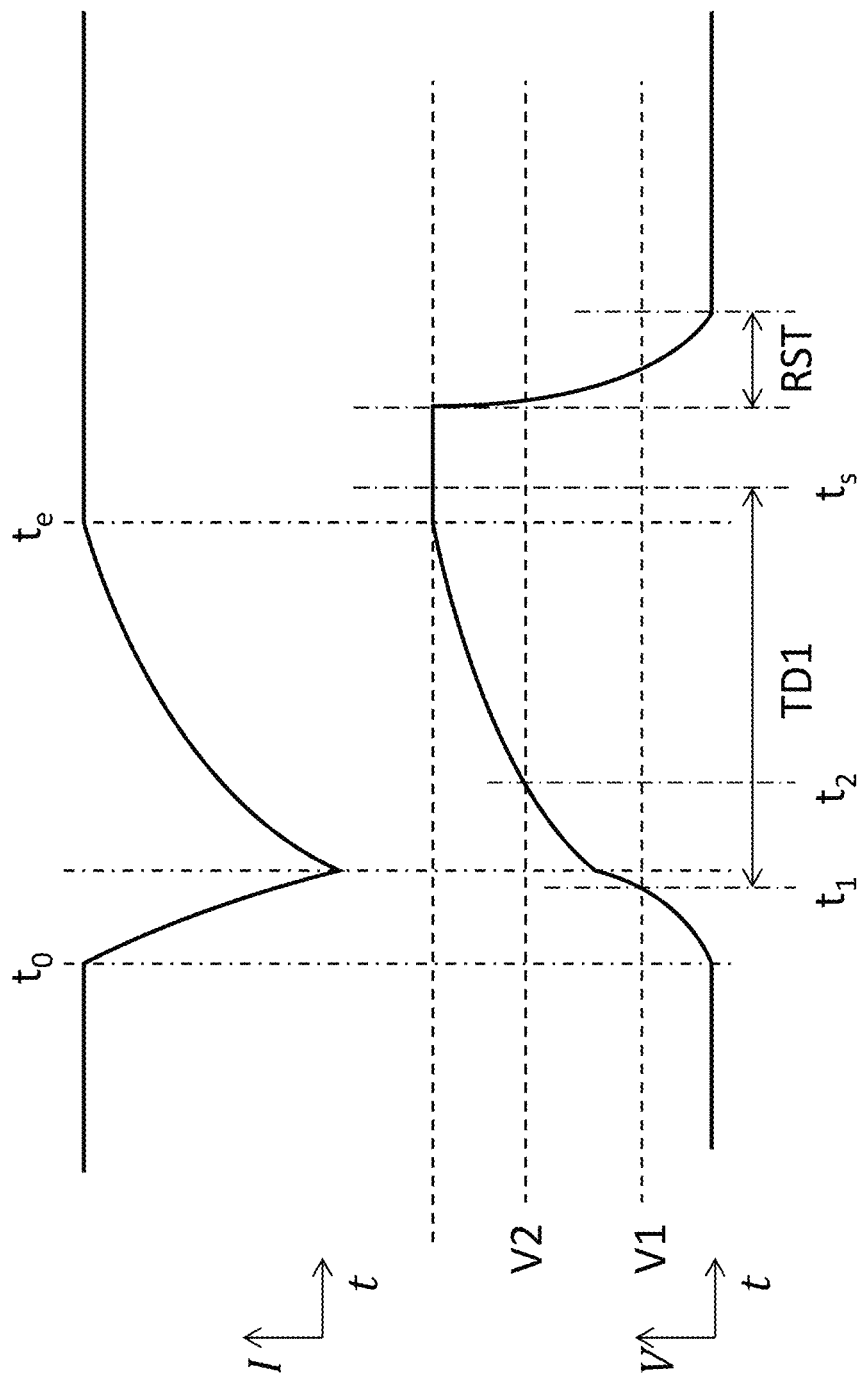
FIG. 4 schematically shows a temporal change of the electric current flowing through an electric contact (upper curve) of the substrate of semiconductor, the electric current caused by charge carriers generated by a particle of radiation incident on the substrate of semiconductor, and a corresponding temporal change of the voltage of the electric contact (lower curve).

The electronic system 121 may include an integrator 309 electrically connected to the contact pad 125, wherein the integrator 309 is configured to collect charge carriers from the contact pad 125. The integrator can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the contact pad 125 accumulate on the capacitor over a period of time ("integration period") (e.g., as shown in FIG. 4, between $t_0$ to $t_1$, or $t_1$-$t_2$). After the integration period has expired, the capacitor voltage is sampled and then reset by a reset switch. The integrator 309 can include a capacitor directly connected to the contact pad 125.

FIG. 4 schematically shows a temporal change of the electric current flowing through the contact pad 125 (upper curve) caused by charge carriers generated by a particle of radiation incident on the substrate 110, and a corresponding temporal change of the voltage of the contact pad 125 (lower curve). The voltage may be an integral of the electric current with respect to time. At time $t_0$, the particle of radiation hits the substrate 110, charge carriers start being generated in the substrate 110, electric current starts to flow through the contact pad 125, and the absolute value of the voltage of the contact pad 125 starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the particle of radiation drift out of the substrate 110. At time $t_s$, the time delay TD1 expires. In the example of FIG. 4, time $t_s$ is after time $t_e$; namely TD1 expires after all charge carriers generated by the particle of radiation drift out of the substrate 110. The rate of change of the voltage is thus substantially zero at $t_s$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by a particle of radiation, which relates to the energy of the particle of radiation. The controller 310 may be configured to determine the energy of the particle of radiation based on voltage the voltmeter 306 measures. One way to determine the energy is by binning the voltage. The counter 320 may have a sub-counter for each bin. When the controller 310 determines that the energy of the particle of radiation falls in a bin, the controller 310 may cause the number registered in the sub-counter for that bin to increase by one. Therefore, the electronic system 121 may be able to detect an image of radiation and may be able to resolve energies of each particle of radiation.

After TD1 expires, the controller 310 connects the contact pad 125 to an electric ground for a reset period RST to allow charge carriers accumulated on the contact pad 125 to flow to the ground and reset the voltage. After RST, the electronic system 121 is ready to detect another incident particle of radiation. If the first voltage comparator 301 has been deactivated, the controller 310 can activate it at any time before RST expires. If the controller 310 has been deactivated, it may be activated before RST expires.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:
1. A method comprising:
    forming a first electrically conductive layer on a first surface of a substrate of semiconductor, wherein the first electrically conductive layer is in electrical contact with the semiconductor;
    bonding, at the first electrically conductive layer, a support wafer to the substrate of semiconductor;
    thinning the substrate of semiconductor;
    forming electric contacts on a second surface of the substrate of semiconductor opposite the first surface;
    obtaining a chip with circuitry therein;
    electrically connecting the circuitry to the electric contacts by bonding the chip to the substrate of semiconductor at the second surface;
    encapsulating the chip and the substrate of semiconductor or exposing at least a portion of first electrically conductive layer by removing the support wafer.
2. The method of claim 1, further comprising forming p-n junctions or p-i-n junctions in the substrate of semiconductor.

3. The method of claim 1, wherein the first surface is polished.
4. The method of claim 1, wherein the first electrically conductive layer comprises a metal.
5. The method of claim 4, wherein the metal comprises Al, Au, or a combination thereof.
6. The method of claim 1, wherein the support wafer comprises a layer of silicon oxide.
7. The method of claim 1, wherein the support wafer comprises a second electrically conductive layer in contact with the first electrically conductive layer after bonding.
8. The method of claim 1, further comprising laser annealing the substrate of semiconductor.
9. The method of claim 1, wherein thinning the substrate of semiconductor comprises performing chemical-mechanical planarization on the substrate of semiconductor, etching the substrate of semiconductor, or both.
10. The method of claim 1, further comprising electrically grounding the first electrically conductive layer.
11. The method of claim 1, wherein the circuitry comprises an electronic system configured to process or analyze electrical signals generated from the substrate of semiconductor.
12. The method of claim 11, wherein the electronic system comprises a contact pad.
13. The method of claim 12, wherein the electronic system comprises:
    a first voltage comparator configured to compare a voltage of the contact pad to a first threshold;
    a second voltage comparator configured to compare the voltage to a second threshold;
    a counter configured to register a number of particles of radiation absorbed by the substrate;
    a controller;
    wherein the controller is configured to start a time delay from a time at which the first voltage comparator determines that an absolute value of the voltage equals or exceeds an absolute value of the first threshold;
    wherein the controller is configured to activate the second voltage comparator during the time delay;
    wherein the controller is configured to cause the number registered by the counter to increase by one, if the second voltage comparator determines that an absolute value of the voltage equals or exceeds an absolute value of the second threshold.
14. The method of claim 13, wherein the electronic system further comprises an integrator electrically connected to the contact pad, wherein the integrator is configured to collect charge carriers from the contact pad.
15. The method of claim 13, wherein the controller is configured to activate the second voltage comparator at a beginning or expiration of the time delay.
16. The method of claim 13, wherein the electronic system further comprises a voltmeter, wherein the controller is configured to cause the voltmeter to measure the voltage upon expiration of the time delay.
17. The method of claim 16, wherein the controller is configured to determine energy of a particle of radiation based on a value of the voltage measured upon expiration of the time delay.
18. The method of claim 13, wherein the controller is configured to connect the contact pad to an electrical ground.
19. The method of claim 13, wherein a rate of change of the voltage is substantially zero at expiration of the time delay.

20. The method of claim 13, wherein a rate of change of the voltage is substantially non-zero at expiration of the time delay.

21. A method comprising:
forming a first electrically conductive layer on a first surface of a substrate of semiconductor, wherein the first electrically conductive layer is in electrical contact with the semiconductor;
bonding, at the first electrically conductive layer, a support wafer to the substrate of semiconductor;
thinning the substrate of semiconductor;
wherein the support wafer comprises a second electrically conductive layer in contact with the first electrically conductive layer after bonding.

22. The method of claim 21, further comprising forming p-n junctions or p-i-n junctions in the substrate of semiconductor.

23. A method comprising:
forming a first electrically conductive layer on a first surface of a substrate of semiconductor, wherein the first electrically conductive layer is in electrical contact with the semiconductor;
bonding, at the first electrically conductive layer, a support wafer to the substrate of semiconductor;
thinning the substrate of semiconductor;
forming electric contacts on a second surface of the substrate of semiconductor opposite the first surface;
obtaining a chip with circuitry therein;
electrically connecting the circuitry to the electric contacts by bonding the chip to the substrate of semiconductor at the second surface;
wherein the circuitry comprises an electronic system configured to process or analyze electrical signals generated from the substrate of semiconductor;
wherein the circuitry comprises an electronic system configured to process or analyze electrical signals generated from the substrate of semiconductor;
wherein the electronic system comprises:
a first voltage comparator configured to compare a voltage of the contact pad to a first threshold;
a second voltage comparator configured to compare the voltage to a second threshold;
a counter configured to register a number of particles of radiation absorbed by the substrate;
a controller;
wherein the controller is configured to start a time delay from a time at which the first voltage comparator determines that an absolute value of the voltage equals or exceeds an absolute value of the first threshold;
wherein the controller is configured to activate the second voltage comparator during the time delay;
wherein the controller is configured to cause the number registered by the counter to increase by one, if the second voltage comparator determines that an absolute value of the voltage equals or exceeds an absolute value of the second threshold.

24. The method of claim 23, wherein the controller is configured to activate the second voltage comparator at a beginning or expiration of the time delay.

* * * * *